United States Patent [19]
Mertol

[11] Patent Number: 5,977,622
[45] Date of Patent: Nov. 2, 1999

[54] STIFFENER WITH SLOTS FOR CLIP-ON HEAT SINK ATTACHMENT

[75] Inventor: Atila Mertol, Cupertino, Calif.

[73] Assignee: LSI Logic Corporation, Milpitas, Calif.

[21] Appl. No.: 08/845,696

[22] Filed: Apr. 25, 1997

[51] Int. Cl.[6] .................................................. H01L 23/22
[52] U.S. Cl. .......................................... 257/687; 257/787
[58] Field of Search ..................................... 257/718, 675, 257/687, 679, 787

[56] References Cited

U.S. PATENT DOCUMENTS

| | | |
|---|---|---|
| 3,305,004 | 2/1967 | Barlowe . |
| 3,377,524 | 4/1968 | Bock . |
| 4,235,285 | 11/1980 | Johnson . |
| 4,323,914 | 4/1982 | Berndlmaier . |
| 4,481,525 | 11/1984 | Calabro . |
| 4,607,685 | 8/1986 | Mitchell . |
| 4,716,494 | 12/1987 | Bright . |
| 4,764,847 | 8/1988 | Eisenblatter . |
| 5,003,429 | 3/1991 | Baker . |
| 5,057,903 | 10/1991 | Ollg . |
| 5,089,936 | 2/1992 | Kojima . |
| 5,172,301 | 12/1992 | Schneider . |
| 5,175,612 | 12/1992 | Long . |
| 5,182,632 | 1/1993 | Bechtel . |
| 5,193,053 | 3/1993 | Sonobe ..................................... 257/675 |
| 5,208,731 | 5/1993 | Blomquist . |
| 5,227,663 | 7/1993 | Patil . |
| 5,230,759 | 7/1993 | Hiraiwa . |
| 5,280,409 | 1/1994 | Seina . |
| 5,304,735 | 4/1994 | Earl . |
| 5,311,060 | 5/1994 | Rostoker . |
| 5,329,426 | 7/1994 | Villani . |
| 5,384,940 | 1/1995 | Soule . |
| 5,386,144 | 1/1995 | Variot . |
| 5,386,342 | 1/1995 | Rostoker . |
| 5,397,919 | 3/1995 | Taty . |
| 5,455,462 | 10/1995 | Marrs . |
| 5,521,439 | 5/1996 | Casati et al. ............................. 257/718 |
| 5,525,835 | 6/1996 | Nishisuchi . |
| 5,548,482 | 8/1996 | Hatauchi . |
| 5,552,634 | 9/1996 | Schneider . |
| 5,552,635 | 9/1996 | Kim . |
| 5,570,271 | 10/1996 | Lavochkin . |
| 5,596,485 | 1/1997 | Glenn . |
| 5,610,442 | 3/1997 | Schneider . |
| 5,615,086 | 3/1997 | Collins . |
| 5,619,399 | 4/1997 | Mok . |
| 5,621,615 | 4/1997 | Dawson . |
| 5,625,222 | 4/1997 | Yoneda . |
| 5,642,265 | 6/1997 | Bond . |
| 5,691,041 | 11/1997 | Frankery . |
| 5,786,631 | 7/1998 | Fishley . |
| 5,789,813 | 8/1998 | Kirkland . |
| 5,808,868 | 9/1998 | Drekmeier . |
| 5,831,829 | 11/1998 | Lin ........................................ 257/719 |

FOREIGN PATENT DOCUMENTS

| | | |
|---|---|---|
| 59-44854 | 3/1984 | Japan . |
| 59-65457 | 4/1984 | Japan . |
| 60-41246 | 3/1985 | Japan . |
| 62-37950 | 2/1987 | Japan . |
| 63-293958 | 11/1988 | Japan . |
| 1-57738 | 3/1989 | Japan . |
| 1-286455 | 11/1989 | Japan . |
| 2-82560 | 3/1990 | Japan . |
| 2-203555 | 8/1990 | Japan . |
| 2-205347 | 8/1990 | Japan . |
| 2-246142 | 10/1990 | Japan . |
| 4-116853 | 4/1992 | Japan . |
| 4-186752 | 7/1992 | Japan . |
| 5-13629 | 1/1993 | Japan . |
| 5-267485 | 10/1993 | Japan . |
| 6-120366 | 4/1994 | Japan . |

OTHER PUBLICATIONS

IBM Technical Disclosure Bulletin, vol. 28 No. 12 May 1986 pp. 5172–5173.

*Primary Examiner*—Carl Whitehead, Jr.
*Assistant Examiner*—Roy Potter

[57] ABSTRACT

An electronic semiconductor device package, the package comprising: a substrate having traces; a die attached to the substrate; first level interconnects of the die to the traces of the substrate; and a stiffener attached to the substrate, wherein the stiffener comprises at least one slot. A system for attaching a heat sink to an electronic semiconductor device package, the system comprising: a stiffener of the electronic package which is attachable to the electronic package; a clip which secures the heat sink to the stiffener; and at least one slot in the stiffener which receives the clip. A method of detachably attaching a heat sink to an electronic semiconductor device package, the method comprising: attaching a stiffener to the package, wherein the stiffener comprises at least one slot; positioning a heat sink adjacent the stiffener; and engaging a clip with the slot and the heat sink, wherein the heat sink is secured to the stiffener by the clip.

2 Claims, 10 Drawing Sheets

STIFFENER WITH SLOTS FOR CLIP-ON HEAT SINK ATTACHMENT

TECHINCAL FIELD

This invention relates to electronic semiconductor packages or assemblies, especially devices for attaching heat sinks to electronic semiconductor packages.

BACKGROUND OF THE INVENTION

Electronic semiconductor packages are well-known and are configured in several different ways. Typically, an electronic semiconductor package includes: a silicon chip (die) containing circuit elements; a substrate, for example, a printed circuit board (PCB); first level interconnects which connect the die and the PCB, i.e., wirebonds, Tape Automated Bonds (TAB) and Controlled Collapse Chip Connection (C4 or flip chip bonds); and second level interconnects, such as external metal pins or solder balls, which connect the substrate to printed wiring circuit cards. Substrates comprise ceramic or plastic materials depending of the particular application. Some semiconductor packages have encapsulant which coats the die and the first level interconnects for protection. A dam or stiffener ring may also be used to hold the encapsulant in place around the die and interconnects as it hardens.

A cross-sectional view of a typical cavity-up electronic semiconductor package is shown in FIG. 1. A semiconductor chip or die 1 is attached to a substrate 2 by die attach epoxy 1a. The die 1 electrically communicates with the traces 3 of the substrate 2 by bond wires 4. A stiffener ring 11 surrounds the die 1 and is attached also to the substrate 2 by epoxy 11a. Encapsulant 6 resides within the stiffener ring 11 and over the die 1 and wirebonds 4. A layer of epoxy 7 is spread over the encapsulant 6 and stiffener ring 11 and a heat sink 8 is attached thereto by the epoxy 7. Solder balls 9 attach the substrate 2 to a printed wiring circuit card, not shown.

During operation, energy is lost in the form of heat which builds up in the electronic semiconductor packages. As junction temperatures increase, reliability and speed are sacrificed. Because failure processes accelerate with increased temperature, the life of each junction becomes shorter as the temperature increases. It is generally well-known to provide means for dissipating heat from the electronic semiconductor package. It is particularly important to dissipate heat from electronic packages with semiconductor devices which operate at high speeds and high power levels.

The path of heat dissipation is considered in two parts: junction-to-case path and case-to-ambient path. The junction-to-case path usually conducts heat directly from the die to a package surface through an encapsulant epoxy. Then the heat is convected from the semiconductor package case to a surrounding ambient (case-to-ambient path) either by natural convection or forced convection. The case-to-ambient heat transfer is enhanced by increasing surface area exposed to ambient air. This is accomplished by employing heat sinks which have many configurations. Fluids such as air, water, etc. are passed over the heat sink to exchange heat from the heat sink surface to the fluid or ambient.

Because the heat dissipation effectiveness of a heat sink is dependent on the thermal resistance of the path between the package and the heat sink, the means of attaching the heat sink to the package is critically important. Typically, heat sinks are constructed from a high thermal conductivity material, such as copper, aluminum or high thermal conductivity plastic. They are attached to the packages with thermally conductive adhesive or epoxy, such as "LOCTITE-384" produced by Loctite Corp. However, if an adhesive is used to attach the heat sink, the heat sink is difficult to detach.

Detachable heat sinks are desirable in applications where it is necessary to remove damaged or defective packages. For example, packages which comprise solder balls as second level interconnects, referred to as "ball grid array" (BGA) packages, may only be removed from a wiring board by heating the solder balls to a melting temperature of the solder. If the package has a non-detachable heat sink, more heat is required to melt the solder balls since the heat sink absorbs most of the heat provided due to high thermal capacitance of the heat sink material. The high intensity heat necessary to melt the solder balls causes damage, in many cases, to surrounding components on the wiring card. A detachable heat sink, however, provides easy access to the defective package by removing the heat sinks before providing sufficient heat to melt the solder balls. Therefore, less heat is required, compared to a non-detachable heat sink package, to melt the solder balls.

Some packages have heat sinks which are attached with screws. The screws extend from the heat sink into the substrate. These packages require a sufficiently thick substrate to support the screws, which in many applications is undesirable.

Alternatively, as shown in FIGS. 2a and 2b, a clip attachment device is shown for attaching a heat sink to an electronic semiconductor package. FIG. 2b is a cross-sectional view of the embodiments shown in FIG. 2a across line A—A The clip 10 extends from one side of the semiconductor chip package to the other. In particular, the ends of the clip 10 curve around the edges of the package to engage the underside of the substrate 2. However, in this configuration, the clip 10 interferes with the solder balls 9 so that fewer input/output solder balls are available for use. Further, as shown in FIGS. 3a and 3b, in packages which employ a dam ring 5, the encapsulant 6 forms a mound over the die. FIG. 3b is a cross-sectional view of the embodiment shown in FIG. 3a across line B—B. These are called "glob-top" packages. The heat sink 8 only contacts the package at the top of the encapsulant 6 in the center of the package. The ends of the clip 10 pull the edges of the substrate in the opposite direction to the force exerted by the heat sink 8 on the encapsulant 6. This generates a significant bending moment in the substrate.

Regardless of whether a package employs a stiffener or a dam ring, this method of clipping adds additional stress to the package substrate which warps the semiconductor package. This warpage is most significant in "glob-top" packages. Further, the clip, which wraps around and engages the edge of the substrate, interferes with the second level interconnects. This interference is particularly detrimental in the case of a ball grid array package.

Therefore, there is a need for a detachable heat sink attachment device which does not generate additional warpage of the package or interfere with the second level interconnects.

SUMMARY OF THE INVENTION

In accordance with one embodiment of the invention, there is provided a stiffener with slots which receive a clip for attaching the heat sink to the package. This stiffener supports the package to reduce or prevent package warpage and prevents the attachment clip from interfering with second level interconnects. In particular, the removable clip-on heat sink is easily attached to the package top surface by clipping to the slots provided in the stiffener. Since slots are provided on each side of the stiffener, directional independent attachment of the heat sink is possible. Also, since the heat sink is not directly clipped to the thin package substrate, there is less bending moment and stress on the package edge. The invention therefore allows greater latitude in the design of the substrate because thinner substrates are possible and traces at the bottom surface of the package substrate may be extended to the very edge of the substrate without interference by a clip.

According to an additional aspect of the invention, there is provided an electronic semiconductor device package, the package comprising: a substrate having traces; a die attached to the substrate; first level interconnects of the die to the traces of the substrate; and a stiffener attached to the substrate, wherein the stiffener comprises at least one slot.

According to a still further aspect of the invention, there is provided a system for attaching a heat sink to an electronic semiconductor device package, the system comprising: a stiffener of the electronic package which is attachable to the electronic package; a clip which secures the heat sink to the stiffener; and at least one slot in the stiffener which receives the clip.

According to an alternative aspect of the invention, there is provided a method of detachably attaching a heat sink to an electronic semiconductor device package, the method comprising: attaching a stiffener to the package, wherein the stiffener comprises at least one slot; positioning a heat sink adjacent the stiffener; and engaging a clip with the slot and the heat sink, wherein the heat sink is secured to the stiffener by the clip.

The stiffener of the invention may be employed in connection with any existing or contemplated electronic systems including integrated circuit devices and semiconductor devices with or without packages, multi-chip modules, flip-chip devices, substrate structures and other forms of electronic component devices and systems that benefit from being cooled.

BRIEF DESCRIPTION OF THE DRAWINGS

The present invention is better understood by reading the following description of nonlimitative embodiments, with reference to the attached drawings wherein like parts in each of the several figures are identified by the same reference character, and which are briefly described as follows.

FIG. 4b is a side view of the stiffener shown in FIG. 4a.

It is to be noted, however, the appended drawings illustrate only typical embodiments of this invention and are therefore not to be considered limiting of its scope, as the invention may admit to other equally effective embodiments.

DETAILED DESCRIPTION OF THE INVENTION

Figure 1:
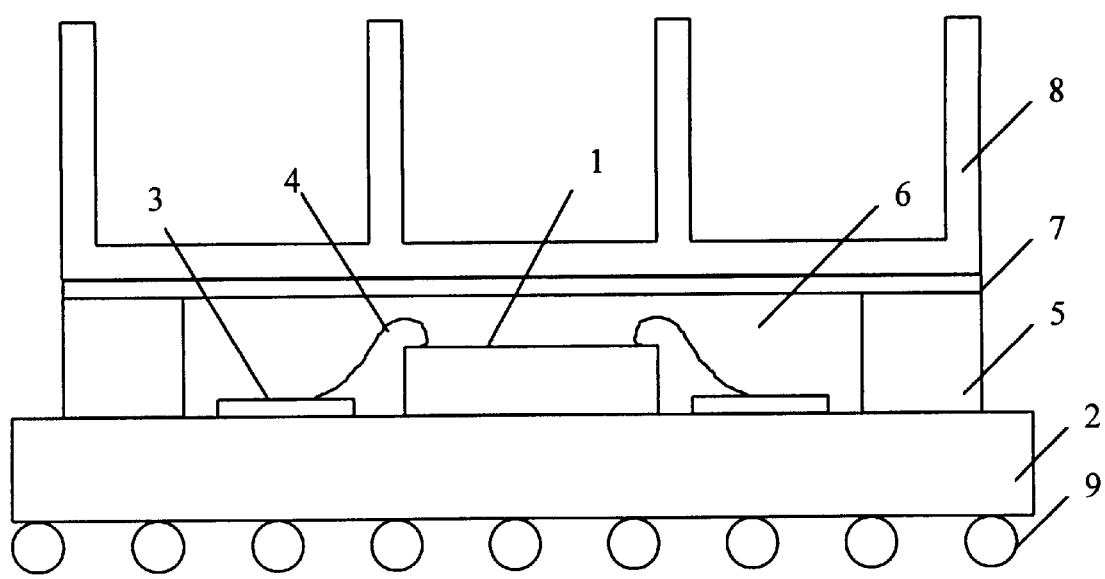
FIG. 1 is a cross-section side view of an electronic semiconductor package with heat sink.
Figure 2A:
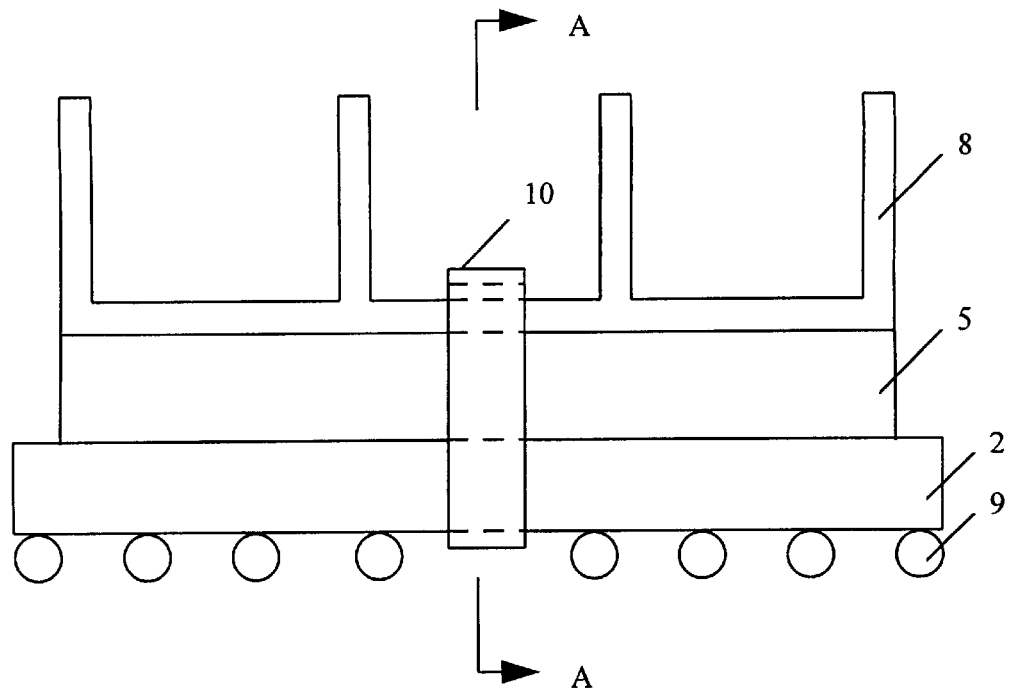
FIG. 2a is a side view of an electronic semiconductor device package with a heat sink attached by a clip.
Figure 2B:
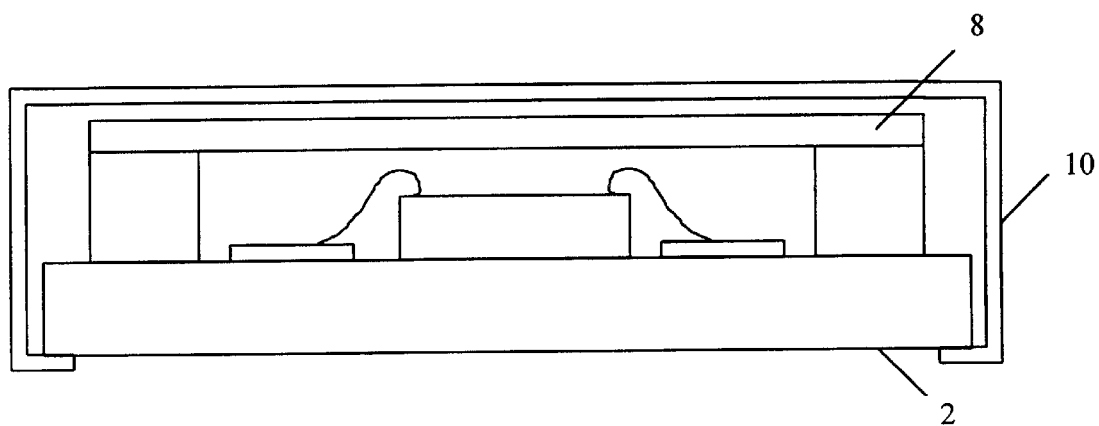
FIG. 2b is a cross-section of the electronic semiconductor device package shown in FIG. 2a across line A—A.
Figure 3A:
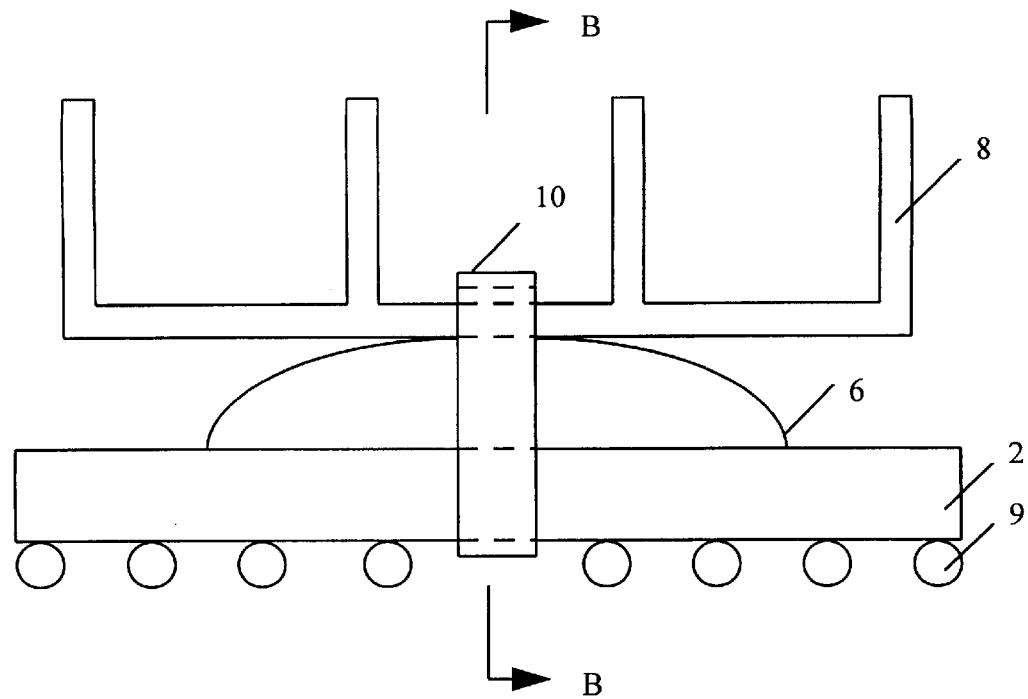
FIG. 3a is a side view of an electronic semiconductor device package with a heat sink attached by a clip.
Figure 3B:
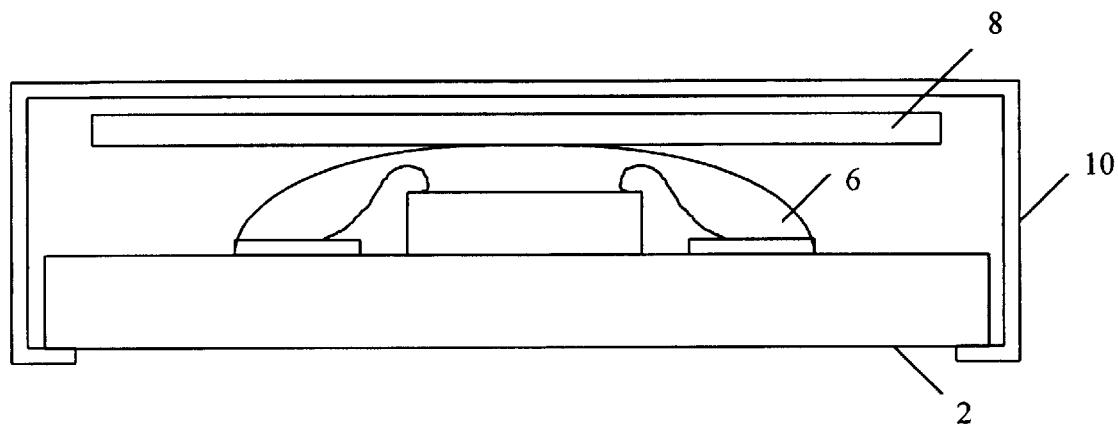
FIG. 3b is a cross-section of the electronic semiconductor device package shown in FIG. 3a across line B—B.
Figure 4A:
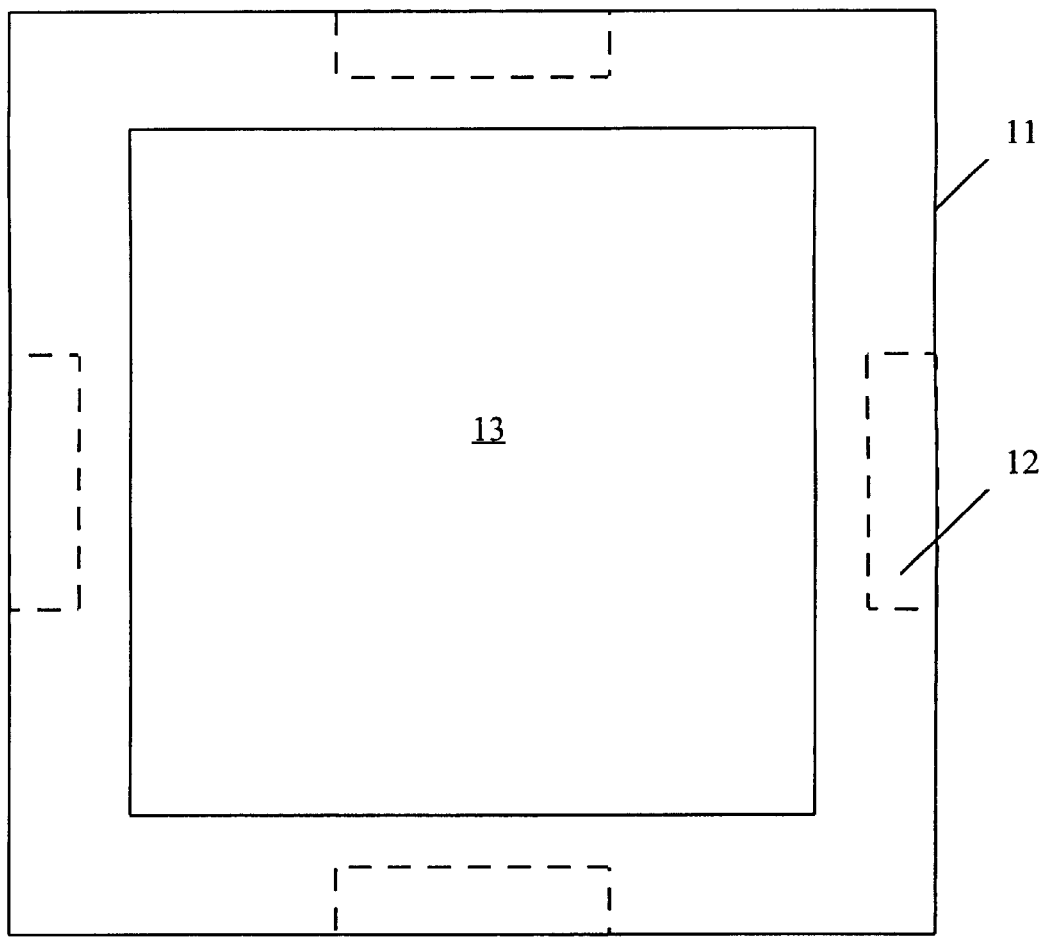
FIG. 4a is a top view of one embodiment of the stiffener.
Figure 4B:
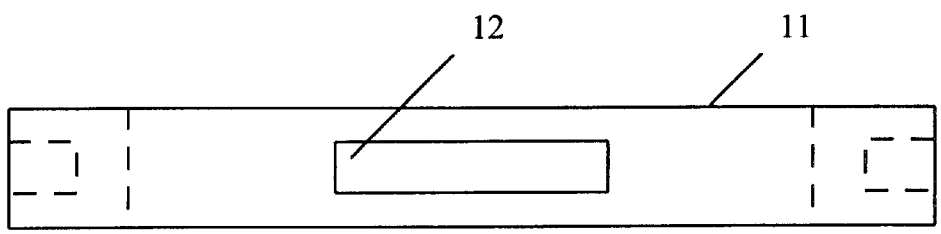
Figure 4C:
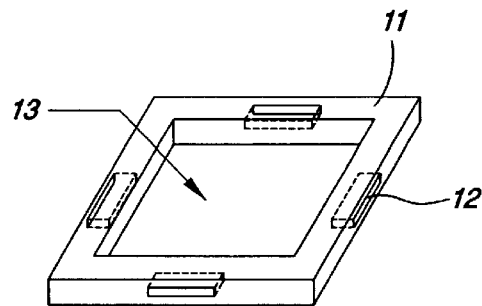
FIG. 4c is a perspective view of the stiffener shown in FIGS. 4a and 4b.

Referring to FIGS. 4a, 4b and 4c, an embodiment of the stiffener of the present invention is shown. FIG. 4a is a top view of the stiffener, while FIGS. 4b and 4c are side and perspective views, respectively. In this embodiment, the stiffener 11 has slots 12 centrally located along each edge of the stiffener 11. Further, the stiffener 11 has an opening 13 for encapsulant. In this configuration, the stiffener 11 functions as a dam ring of the encapsulant which is placed in the opening 13. The stiffener 11 is sufficiently thick and wide to support the semiconductor package to reduce or prevent package warpage.

The heat sink attachment stiffener of the present invention is used with any electronic device or system which benefits from being cooled. In particular, the stiffener is used with electronic semiconductor packages which comprise: a silicon chip (die), reference character 1 in FIG. 7b; a substrate 2; first level interconnects 4 which connect the die 1 to the traces 3 of the substrate 2; and second level interconnects 9 which connect the substrate 2 to printed wiring circuit cards, not shown. The die is attached to the substrate by any known means such as silver-filled epoxy, solder or epoxy. The substrate comprises upper conductive traces 3 which electrically connect to lower conductive traces by electrically conductive vias. The vias pass through the substrate to complete the connection between the first level interconnects and second level interconnects. In some embodiments, the semiconductor device package comprises any first level interconnect device known to those of skill, such as wirebonds, Tape Automated Bonds (TAB) and Controlled Collapse Chip Connection (C4 or flip chip bonds). Embodiments of the package also comprise known second level interconnects, such as external metal pins or solder balls. Electronic semiconductor device packages also comprise encapsulant 6 which coats the die 1 and the first level interconnects 4 for protection. With the encapsulant 6, the package is sometimes referred to as a "glob-top" package.

Figure 7A:
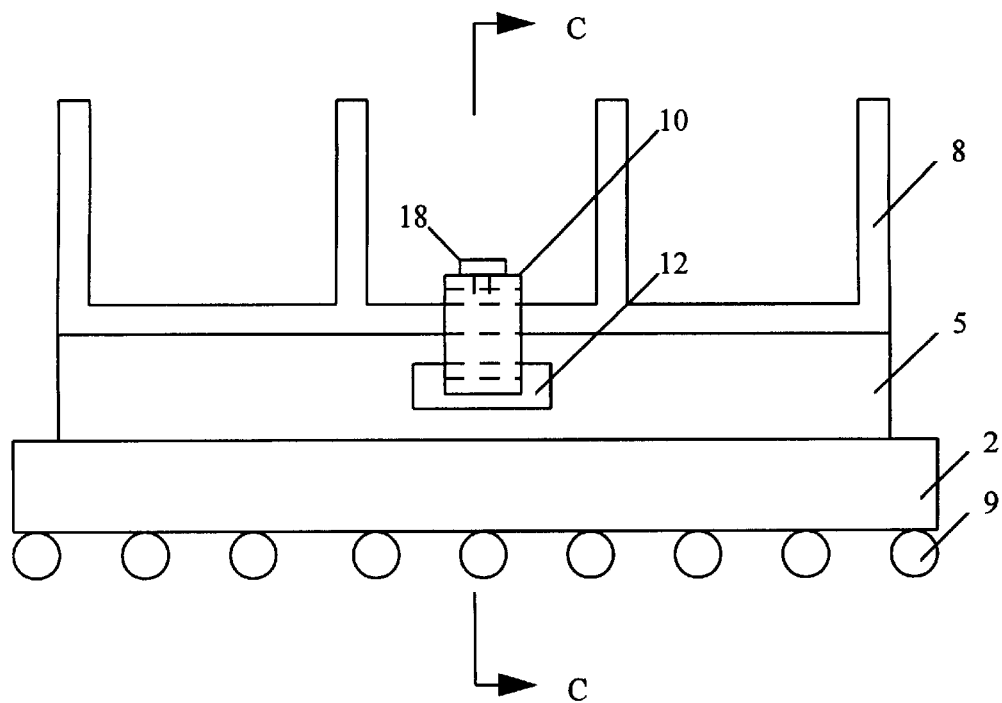
FIG. 7a is a side view of a semiconductor chip package with a heat sink attached to a stiffener by a clip.
Figure 7B:
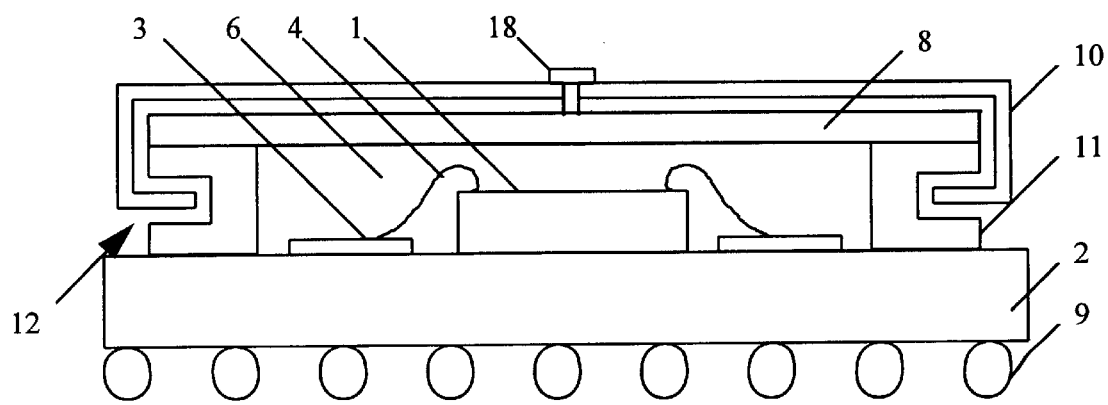
FIG. 7b is a cross-section of the electronic semiconductor device package shown in FIG. 7a across line C—C.

Referring to FIGS. 7a and 7b, an electronic semiconductor package is shown with an attached heat sink. FIG. 7b is a cross-sectional view of the semiconductor package shown in FIG. 7a across line C—C. For purposes of discussion, the die 1 of the semiconductor package is attached by wire bond first level interconnects 4 to the traces 3 of the substrate 2. However, the present invention may be used with any semiconductor package configuration. An embodiment of the stiffener 11 is attached to the substrate 2 and surrounds the die 1 and bond wires 4. The stiffener 11 also serves as a dam ring to enclose encapsulant 6 in the opening 13 (see FIG. 4a) of the stiffener 11. A heat sink 8 is adjacent the encapsulant 6 and the stiffener 11. The heat sink 8 is secured in place by a clip 10 which extends across the heat sink 8. The ends of the clip 10 are curved around the outside edges of the heat sink 8 and protrude into slots 12 at opposite sides of the stiffener 11. A screw 18 is threaded through the center of the clip 10 with the head of the screw on the outside of the clip 10. The end of the screw opposite the head abuts against the heat sink 8.

Figure 5:
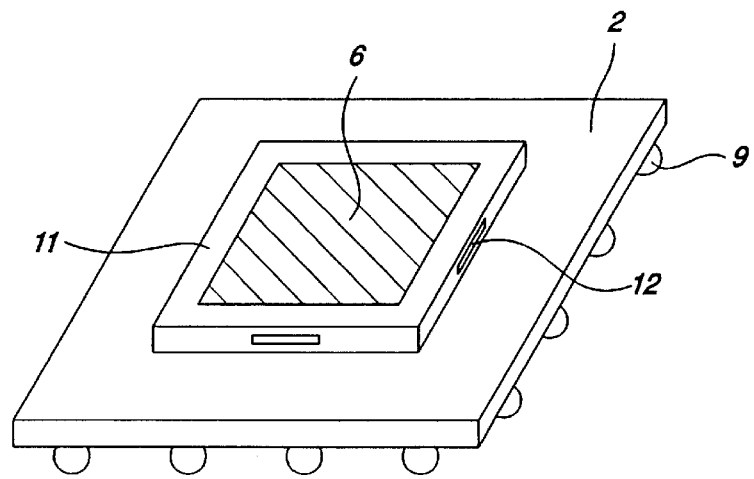
FIG. 5 is a perspective view of a stiffener attached to a package substrate and encapsulant covering the die.
Figure 6:
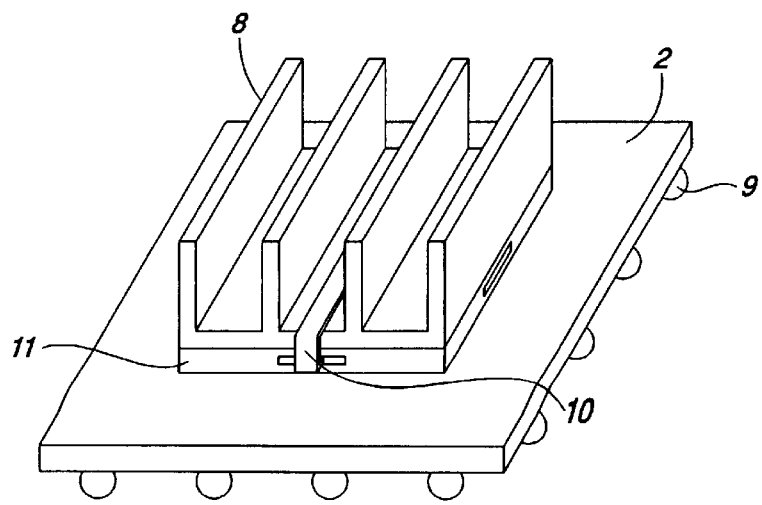
FIG. 6 is a perspective view of a stiffener attached to a package substrate and a heat sink attached to the stiffener by a clip.

A package is assembled by first attaching the die 1 to the substrate 2. Next, the first level interconnects 4 are secured to electrically connect the pads on the die 1 to the upper traces 3 on the substrate 2. As shown in FIG. 5, a stiffener 11 is then attached to the substrate 2 and liquid encapsulant 6 is poured over the die 1 and first level interconnects 4 within the stiffener 11. The encapsulant 6 is allowed to solidify by a curing process. Next, as shown in FIG. 6, a heat sink 8 is placed adjacent the stiffener 11 and the encapsulant 6 and a clip 10 is wrapped around the heat sink and engaged with the slots 12 of the stiffener 11. After the clip ends have been inserted into the slots 12 of the stiffener 11, the screw 18, see FIGS. 7a and 7b, is screwed into the clip 10. As more of the screw 18 passes through the clip 10, a center portion of clip 10 in the vicinity of the screw 18 is pushed away from the heat sink 8. This in turn causes the ends of the clip 10 to extend further into the slots 12 of the stiffener 11. In this fashion, the tension in the clip 10 is adjusted. Second level interconnects 9 are attached to the bottom surface of the package substrate 2 before the heat sink is attached.

Because the stiffener 11 also functions as a dam ring, there is no need to use a dam ring during the encapsulation process. As encapsulant is poured into the opening of the stiffener 11, the stiffener pools the encapsulant. A suitable encapsulant is found in an epoxy, such as Hysol FP4450, produced by Dexter Corp. If the encapsulant is filled to the top of the stiffener, a uniform surface is created which extends from one upper edge of the stiffener, across the encapsulant and finally to the opposite upper edge of the stiffener. This controlled encapsulant process provides a flat surface interface for complete interaction with the heat sink. The thermal connection is further improved by a layer of thermally conductive material, e.g., silicone grease or paste. One suitable grease is "OMEGATHERM" produced by Omega Corporation. Alternatively, a thermal tape, such as "T-Flex" produced by Thermagon, Inc., may be used. Finally, the thermally conductive material may be a phase change material, which is solid while the package is cool, but liquid as the package heats up. One phase change material is "T-Pli 205-AO" also produced by Thermagon, Inc. The thermally conductive material fills gaps between the encapsulant and the heat sink.

In an alternative stiffener embodiment, several slots 12 are located along a single edge of the stiffener 11. This allows the clip 10 to be optionally engaged with slots at different positions around the stiffener 11 or allows for multiple clips 10 to be used simultaneously. In one embodiment, the width of the slots 12 is only slightly greater than the width of the clip 10. This stabilizes the clip 10 against lateral movement. Further, while the embodiment of the stiffener 11 shown in the figures is rectangular, alternative stiffeners are disc shaped or shaped similar to the semiconductor device package. In different embodiments, the stiffener is made of powdered metal or thermally-conductive material such as aluminum, copper, copper/tungsten, plastic or any other known material.

Any heat sink configuration known in the art may be used in conjunction with the stiffener of the present invention. Examples of heat sink configurations include: pin, fin and ducted heat sinks. The pin configurations provide a plurality of parallel cooling fins which rise vertically from a horizontal surface or base member. The pins themselves comprise various cross-sections and longitudinal shapes. The fin heat sinks have vertical fins, of many possible cross-sections, which rise from a horizontal base member. The ducted heat sinks comprise a horizontal top member which is attached to the pins or fins opposite the horizontal base member. Embodiment of the heat sink are formed with powdered metal or thermally-conductive material such as aluminum, copper, copper/tungsten, plastic or any other known material.

The stiffener 11 is attached to the substrate 2 by any means known to those of skill in the art. For example, in one embodiment, the stiffener 11 is attached by a known silicone-based epoxy disposed between the bottom surface of the stiffener 11 and the upper surface of the substrate 2. Alternatively, the stiffener 11 is attached to the substrate by double sided adhesive tape also known in the art. Further, the stiffener 11 is attached by screws which extend into both the stiffener and the substrate. In a still further embodiment, the stiffener 11 is attached to the substrate 2 by the encapsulant 6 itself. This embodiment is described in greater detail with respect to FIG. 8.

Figure 8:
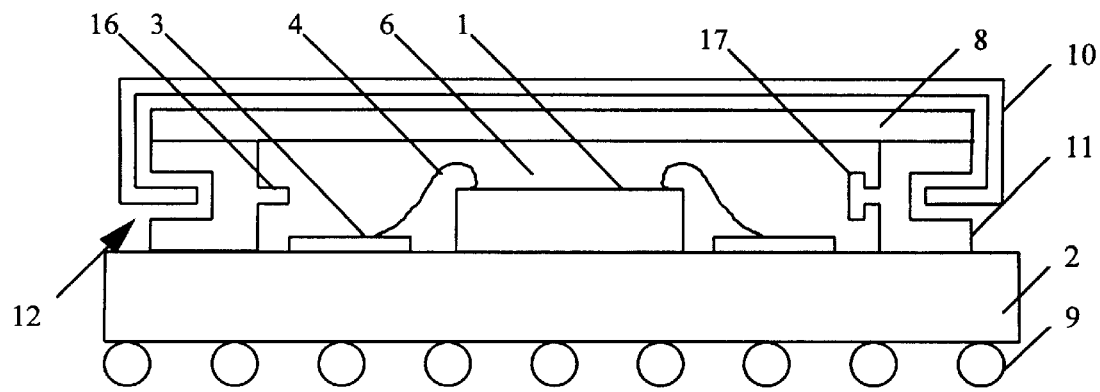
FIG. 8 is a cross-section of a stiffener embodiment of the invention comprising a protrusion for anchoring the stiffener to the encapsulant.

As shown in FIG. 8, the stiffener 11 is provided with a protrusion 16 which extends into the interior of the stiffener 11 toward the die 1. During the encapsulation process, encapsulant 6 flows around the protrusion 16 and, once hardened, secures the stiffener 11 to the substrate 2. Numerous suitable protrusions will occur to those of skill in the art. For example, in one embodiment, the protrusion 16 comprises a single protrusion which extends around the entire circumference of the opening 13 (see FIG. 4a) for the encapsulant 6. Alternatively, the protrusion 16 comprises separate, individual protrusions which are located at various points around the opening. Additionally, as shown in FIG. 8, some embodiments of the protrusion 16 comprise ridges 17 at the distal end of the protrusion 16 which extend above and below the protrusion to ensure engagement between the protrusion 16 and the encapsulant 6.

Figure 9:
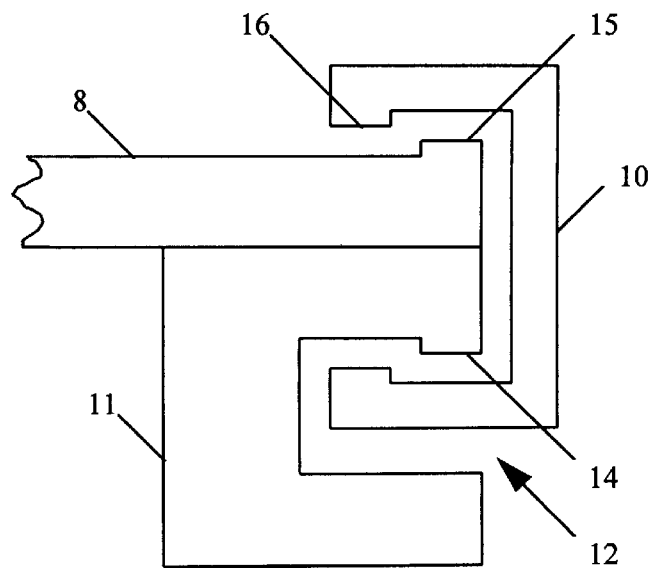
FIG. 9 is a cross-section of a "C" clip embodiment of the invention.

Referring to FIG. 9, the drawing shows a cross-sectional side view of a C-clip embodiment of the invention. The clip 10 comprises a short C-clip which extends from within the slot 12 to the edge of the heat sink 8. In this embodiment, the upper inside edge of the slot 12 has a ridge 14 which extends perpendicularly from the interior wall of the upper surface of the slot 12. Similarly, the heat sink 8 has a ridge 15 which extends upwardly from the inside edge of the heat sink 8. The clip 10 is shaped like a "C" so as to extend from the upper surface of the heat sink 8 around the peripheral edge of the heat sink and the stiffener 11 and into the slot 12. The ends of the clip 10 have ridges 16 which extend into the interior of the "C" configuration of the clip 10. These ridges 16 extend over and hook behind ridges 14 and 15 on the stiffener 11 and the heat sink 8. The ridges prevent the clip 10 from prematurely disengaging from the slot 12. Depending on the particular embodiment, any number of C-clips 10 are used to secure the heat sink 8 to the stiffener 11.

Figure 10A:
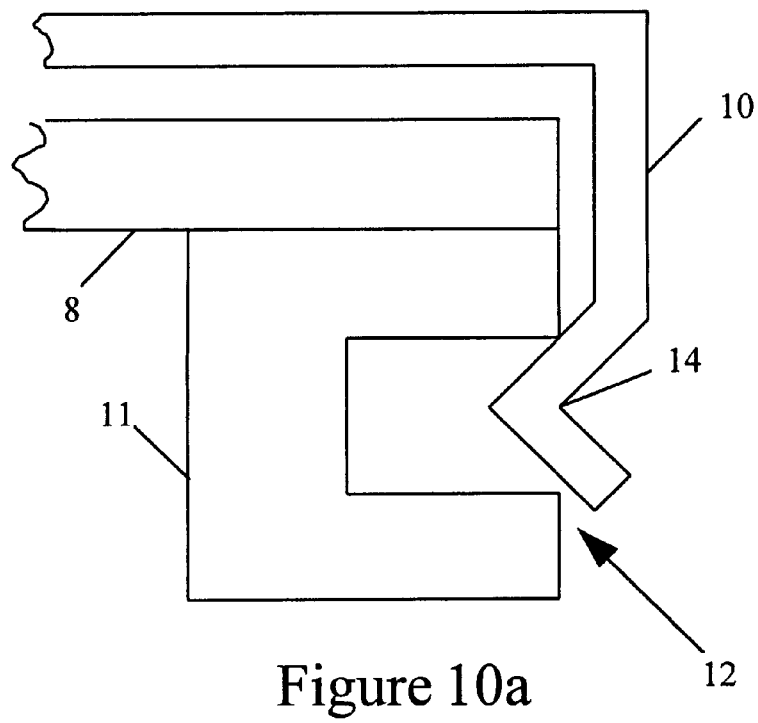
FIG. 10a is a cross-section of an embodiment of the invention wherein the clip comprises an elbow bend.

Referring to FIG. 10a, an embodiment of the invention is shown with an alternative clip. In this embodiment the clip 10 curves around the end of the heat sink 8 downwardly toward the slot 12 in the stiffener 11. The clip 10 comprises an elbow bend 14 which protrudes into and back out of the slot 12. The clip 10 comprises a similarly shaped elbow bend, not shown, which protrudes in the opposite direction into a slot opposite the slot 12 shown in the figure. The clip 10 is made of a material which allows the clip to elastically deform as the clip 10 is placed on the package. The elbow bends 14 are pulled away from each other as the clip 10 is positioned over the stiffener 11 and the heat sink 8. Once in position, the clip 10 is released to allow the elbow bends 14 to spring toward each other and to protrude into opposite slots 12 in the stiffener 11. This embodiment allows the clip 10 to be more easily removed.

An alternative embodiment comprises a clip 10 which, at one end, comprises a straight end which protrudes directly into the slot 12, as shown in FIG. 7b, while the opposite end comprises an elbow bend, as shown in FIG. 10a.

Figure 10B:
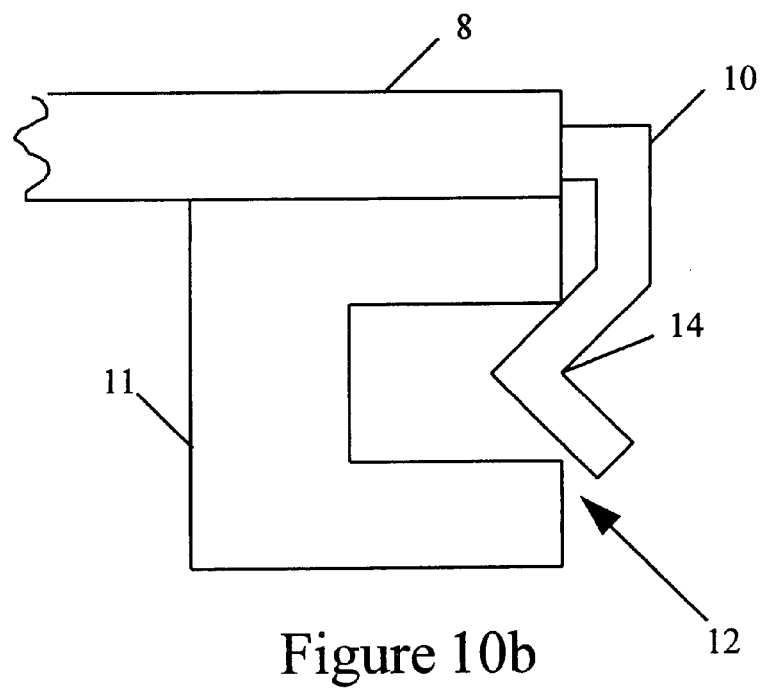
FIG. 10b is a cross-section of an embodiment of the invention wherein the clip comprises an elbow bend and the clip is integral with the heat sink.

Referring to FIG. 10b, an embodiment of the invention is shown wherein the clip 10 is integral with the heat sink 8. The clip 10 extends from the outside end of the heat sink 8, curves toward the stiffener 11, and protrudes into the slot 12 of the stiffener 11.

Figure 11:
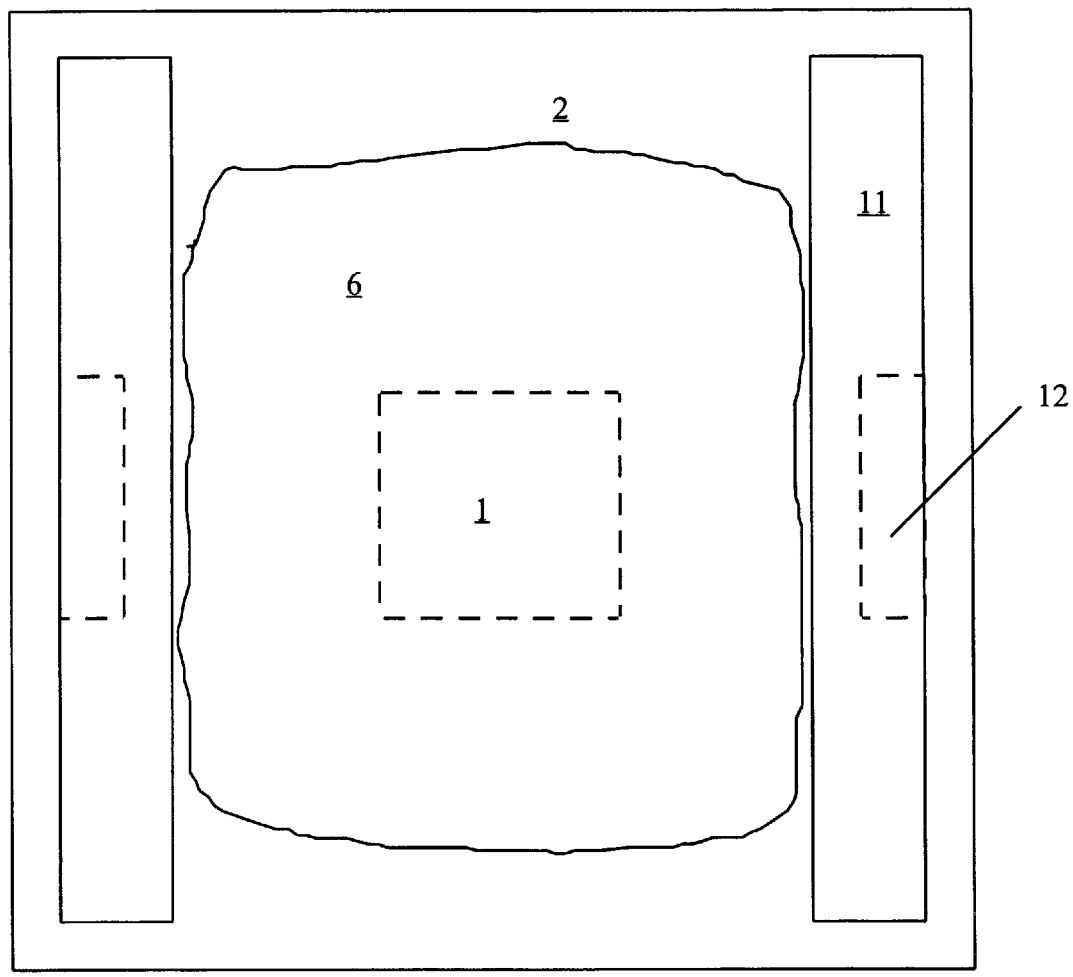
FIG. 11 is a top view of a "glob-top" electronic semiconductor package with two stiffeners.

Referring to FIG. 11, a top view of an embodiment of the invention is shown wherein two stiffeners are attached to the semiconductor package. Again, the semiconductor chip package comprises a substrate 2. The die 1 is attached to the substrate 2 in a central location. A mound of encapsulant or "glob-top" 6 covers the die 1 and the central portion of the substrate 2. Two individual stiffeners 11 are attached to opposite ends of the package. Each of the stiffeners 11 has a slot 12 which faces outwardly. Similar to the previous embodiments, a heat sink, not shown, is attachable to the stiffeners 11 by a clip which is insertable into the slots 12. When the heat sink is attached to the stiffeners 11, a gap exists between the substrate and the perimeter of the heat sink where the heat sink is not supported by the stiffeners 11. Therefore, one heat sink which could be used with the two stiffener configuration comprises steps at opposite sides of the heat sink. The steps extend from the bottom surface of the heat sink to the substrate at the perimeter of the heat sink where it is not supported by the stiffeners. Of course, it is important that the step be placed at the perimeter so as not to interfere with the encapsulant 6. This improves the thermal conduction path between the substrate and the heat sink.

Figure 12:
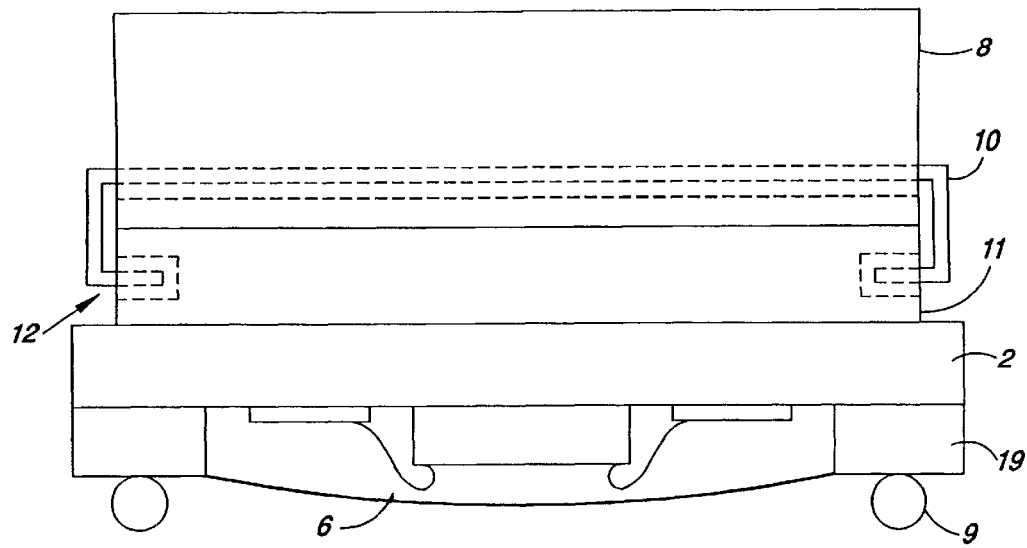
FIG. 12 is a side view of a stiffener embodiment of the invention attached to a cavity down semiconductor device package.

Referring to FIG. 12, a cross-section of a cavity-down semiconductor package is shown. The components of the cavity-down package are similar to the cavity-up configurations previously discussed, except the die and first level interconnects are positioned on the underside of the substrate, i.e, the side which faces the printed wiring board. Also, additional lamination layers 19 may be added to the substrate to support the second level interconnects. In this embodiment, the stiffener 11 does not require an opening for encapsulant because the die 1 is on the opposite side of the substrate. As before, the stiffener 11 is provided with slots 12 formed in its exterior sides for receiving the hook portions of clip 10. This allows the heat sink 8 to be firmly attached to the stiffener 11 by the clip 10.

Figure 13:
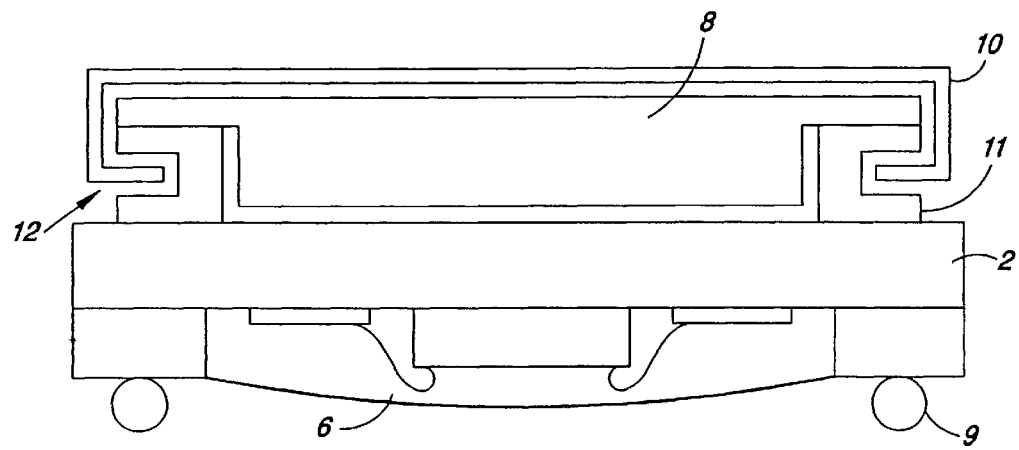
FIG. 13 is a cross-section view of an alternative embodiment of the invention attached to a cavity down electronic semiconductor device package.

Referring to FIG. 13, an alternative embodiment of the invention for attaching a heat sink to a cavity down semiconductor package is shown. In this embodiment, the stiffener 11 comprises an opening similar to the opening 13 shown in FIG. 4a. However, rather than filling the interior of the opening with encapsulant, the heat sink 8 protrudes into the opening. As before, a clip 10 secures the heat sink 8 to the semiconductor chip package. As with all of these embodiments, thermal grease is applied between the heat sink 8 and the substrate 2 to improve the thermal conduction of the pathway.

Figure 14:
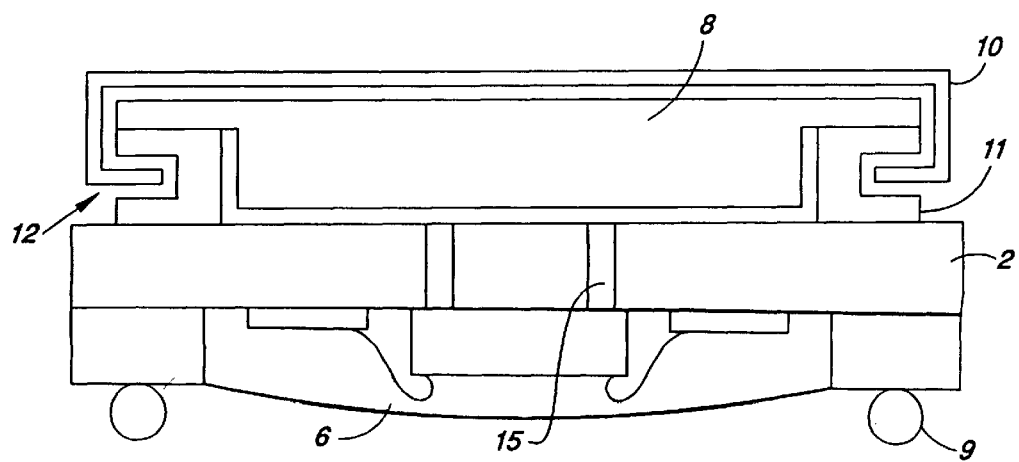
FIG. 14 is a cross-section view of an alternative embodiment of the invention attached to a cavity down electronic semiconductor device package wherein the substrate comprises thermally conductive vias.

As shown in FIG. 14, a further embodiment of the invention comprises thermally conductive vias. The vias 15 extend through the substrate 2 from the die 1 to the heat sink 8. The vias 15 are filled with a thermally conductive material, such as copper, silicon carbide or aluminum nitride, which provides a path for thermal conduction through the substrate from the die to the heat sink 8. Alternatively, the vias 15 comprise a large single via approximately the same size width as the die.

While the particular embodiments for electronic semiconductor device packages as herein shown and disclosed in detail are fully capable of obtaining the objects and advantages herein before stated, it is to be understood that they are merely illustrative of the presently preferred embodiments of the invention and that no limitations are intended by the details of construction or design herein shown other than as described in the appended claims.

I claim:

1. An electronic semiconductor device package, said package comprising:

a substrate having traces;

a die attached to said substrate;

first level interconnects of said die coupled to the traces of said substrate;

a stiffener attached to said substrate, wherein said stiffener comprises at least one slot; wherein said stiffener comprises an opening for encapsulate, whereby the stiffener functions as a dam ring.

2. A system for attaching a heat sink to an electronic semiconductor device package, the system comprising:

a stiffener of the electronic package which is attachable to the electronic package;

a clip which secures the heat sink to said stiffener;

at least one slot in said stiffener which receives said clip; and an opening for encapsulant, whereby the stiffener functions as a dam ring.

* * * * *